United States Patent [19]

Yamada

[11] Patent Number: 4,596,939
[45] Date of Patent: Jun. 24, 1986

[54] SCHMITT TRIGGER INPUT GATE HAVING DELAYED FEEDBACK FOR PULSE WIDTH DISCRIMINATION

[75] Inventor: Tatsuo Yamada, Hyogo, Japan

[73] Assignee: Mitsubishi Denki Kabushiki Kaisha, Tokyo, Japan

[21] Appl. No.: 525,753

[22] Filed: Aug. 23, 1983

[30] Foreign Application Priority Data

Aug. 23, 1982 [JP] Japan ................................. 57-147463

[51] Int. Cl.$^4$ ............................................. H03K 3/295
[52] U.S. Cl. ..................................... 307/290; 307/443; 307/359; 307/279; 307/605
[58] Field of Search ............... 307/443, 475, 510, 517, 307/518, 234, 351, 354, 359, 362, 279, 290, 596, 605; 328/111, 115, 129.1

[56] References Cited

U.S. PATENT DOCUMENTS

| 4,071,784 | 1/1978 | Maeder et al. | 307/290 X |
|---|---|---|---|
| 4,112,317 | 9/1978 | Everswick | 307/234 X |
| 4,233,563 | 11/1980 | Schanbacher | 328/111 X |
| 4,268,764 | 5/1981 | Eckert | 307/290 X |
| 4,376,251 | 3/1983 | Kobayashi et al. | 307/290 X |
| 4,392,066 | 7/1983 | Hirao | 307/290 |
| 4,430,587 | 2/1984 | Tennyson | 307/605 X |
| 4,459,494 | 7/1984 | Takakura | 307/290 |
| 4,464,587 | 8/1984 | Suzuki et al. | 307/290 X |
| 4,471,235 | 9/1984 | Sakhuja et al. | 307/234 |

FOREIGN PATENT DOCUMENTS

| AS1124089 | 2/1962 | Fed. Rep. of Germany . |
| OS2734008 | 3/1978 | Fed. Rep. of Germany . |
| AS2026143 | 5/1978 | Fed. Rep. of Germany . |
| 143943 | 9/1980 | German Democratic Rep. . |
| 56-94827 | 7/1981 | Japan . |

OTHER PUBLICATIONS

Radio Fernsehen Elektronik, 27, 1978, H.5, p. 308.
Nachrichtentechnik-Elektronik, 32, 1982, H.1, p. 35.

*Primary Examiner*—John S. Heyman
*Assistant Examiner*—D. R. Hudspeth
*Attorney, Agent, or Firm*—Sughrue, Mion, Zinn, Macpeak, and Seas

[57] ABSTRACT

An input amplifier circuit, specifically, an input amplifier circuit for logic signals, in which noise signal components having a duration less than a predetermined duration are eliminated from the output signal of the amplifier. A delay circuit is added to the feedback loop of a Schmitt trigger amplifier circuit which has a delay time equal to the predetermined delay. The delay circuit effectively inhibits the output signal from changing state unless the input signal has a duration greater than the predetermined duration.

11 Claims, 5 Drawing Figures

SCHMITT TRIGGER INPUT GATE HAVING DELAYED FEEDBACK FOR PULSE WIDTH DISCRIMINATION

BACKGROUND OF THE INVENTION

The present invention relates to an improved input amplifier circuit which may be employed in a semiconductor integrated circuit or the like.

In a semiconductor integrated circuit, noise signals are most likely to enter an input amplifier circuit at its input terminal. If such an external noise signal is indiscriminately applied to the input amplifier circuit, the integrated circuit may operate erroneously. In order to overcome this difficulty, an input amplifier circuit based on a Schmitt trigger circuit may be employed.

FIG. 1 is a circuit diagram showing an example of a conventional input amplifier circuit employing a Schmitt trigger circuit configuration implemented with N channel MOS field-effect transistors (FETs). In FIG. 1, reference numeral 1 designates a Schmitt trigger amplifier, 2 an input terminal, 3 an output terminal, 4 a first power source terminal for supplying a voltage $V_{DD}$ to drive the Schmitt trigger amplifier 1, and 5 a return line for supplying a return line voltage $V_{SS}$ such as a ground level, the return line being a second power source terminal. An FET 6 is of the depletion type, while FETs 7 and 8 are of the enhancement type. The FETs 7 and 8 are connected at a junction point 9 forming a series circuit. The input terminal 2 is connected to the gates of the FETs 7 and 8. The FETs 6 and 7 are connected at a junction point which is further connected to the gate of the FET 6, to the gate of an enhancement-type FET 10, and to the output terminal 3. The drain and source electrodes of the FET 10 are connected to the power source terminal 4 and the junction point 9, respectively.

The operation of this input amplifier circuit when a signal is applied to the input terminal will be described with respect to the case where the input signal is a positive logic signal.

In the case where a voltage lower than the threshold voltage of the FET 8 is applied to the input terminal 2, the Schmitt trigger amplifier 1 is maintained in a steady state. The FETs 7 and 8 are then non-conductive (off), and, because the FET 6 is a depletion-type MOS transistor, the potential at the output terminal 3 is a high level. As the output terminal 3 is at the high level, the FET 10 is rendered conductive, and thus the potential at the junction point 9 is much higher than that at the input terminal 2.

When the potential at the input terminal 2 exceeds the threshold voltage $V_{T8}$ of the FET 8, the FET 8 is rendered conductive, that is, it is in a low impedance state, so that current flows from the source of the feedback FET 10 through the FET 8 via the junction point 9. In this operation, the FET 7 is nonconductive, that is, it is in a high impedance state. When the input voltage increases further and exceeds the sum $V_{IH}$ of the threshold value $V_{TH}$ of the FET 7 and the potential $V_9H$ at the junction point 9, both FETs 7 and 8 become conductive. The potential at the output terminal 3 is then set to the low level, whereby the FET 10 is rendered nonconductive. Even when the input voltage exceeds the above-described value $V_{IH}$, this state is maintained. The relation between input voltage and output voltage is thus as indicated by a line a in FIG. 2.

The case where the input voltage decreases from a value larger than the value $V_{IH}$ will now be considered. When the input voltage becomes lower than the sum $V_{IL}$ of the threshold voltage $V_{7L}$ of the FET 7 and the potential $V_{9L}$ at the junction point 9, the FET 7 is rendered non-conductive. As the FET 6 is a depletion-type MOS transistor, the potential of the output terminal 3 will then be raised to a high level by the FET 6. The potential $V_{9L}$ at the junction point 9 when the low impedance state of the FET 7 is changed to the high impedance state is lower than the potential $V_{9H}$ at this same point when the high impedance state of the FET 7 is changed to the low impedance state. Accordingly, the input voltage $V_{IH}$ in moving from the low impedance state of the FET 7 to the high impedance state is lower than that in the case of changing from the high impedance state of the FET 7 to the low impedance state. The relation between the input voltage and output voltage in this operation is as indicated by the line b in FIG. 2.

The Schmitt trigger amplifier circuit arranged as described above thus has two different threshold voltages: the threshold voltage $V_{IH}$ in shifting the input voltage from the low level to the high level and the threshold voltage $V_{IL}$ in shifting the input voltage from the high level to the low level. Accordingly, in the Schmitt amplifier circuit 1 constructed as described above, there is little likelihood of an erroneous operation occurring with a noise input which rises to the high level from the low level and with a noise input which falls to the low level from the high level when compared with an input amplifier circuit having only one threshold value $V_N$ ($V_{IH} > V_N > V_{IL}$). This will be described in more detail with reference to FIG. 3.

FIG. 3 shows an input voltage wavefrom A and an output voltage waveform B derived from the waveform A. If a noise input voltage is higher than $V_N$ (the threshold voltage in an input amplifier circuit having only one threshold voltage) but lower than $V_{IH}$, then the output voltage is unchanged. Also, when the input voltage is higher than the threshold value, the output voltage falls to low state, and the noise input voltage is lower than $V_{IH}$, the output voltage is maintained unchanged.

In the above-described Schmitt trigger amplifier circuit 1, it is theoretically possible to decrease the probability of erroneous operation by increasing the threshold voltage $V_{IH}$ and decreasing the threshold voltage $V_{IL}$. However, in practice, it is difficult to precisely set these voltages to desired levels because the voltages depend on the electrical characteristics of a signal source circuit (now shown) connected to the input terminal 2. Thus, it is rather difficult to make the Schmitt trigger amplifier circuit 1 eliminate noise signals as desired.

SUMMARY OF THE INVENTION

Overcoming the drawbacks of the foregoing, the invention provides an input amplifier circuit in which, based on the fact that the pulse width of a noise signal is generally smaller than that of an information bearing input signal, a delay circuit is added to the feedback loop of a Schmitt trigger amplifier circuit to thus eliminate the effects of a noise signal which exceeds a set threshold value but which has a narrow width.

More specifically, the invention provides an input amplifier circuit including a Schmitt trigger circuit having an input terminal, an output node and a feedback node with the voltage appearing at the output node having a hysteretic characteristic with respect to an input voltage applied to the input terminal. Delay circuit means is provided which supplies a potential at the output node of the Schmitt trigger circuit to the feedback node of the same circuit with a predetermined delay time, and also for providing an output at an output terminal according to the input voltage applied to the input terminal.

DESCRIPTION OF THE PREFERRED EMBODIMENTS

Figure 1:
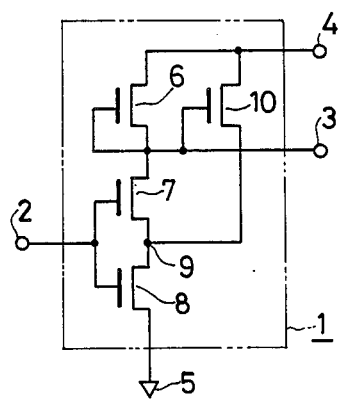
FIG. 1 is a circuit diagram of an example of a conventional input amplifier circuit based on a Schmitt trigger circuit.
Figure 2:
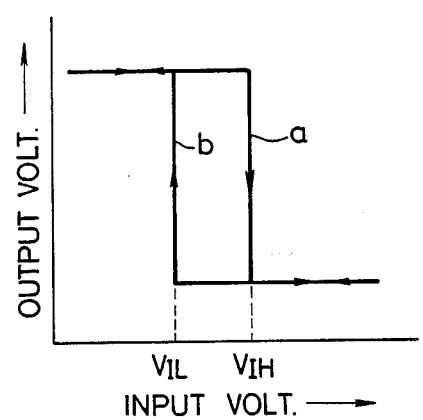
FIG. 2 is an input-output characteristic diagram of the circuit of FIG. 1.
Figure 3:
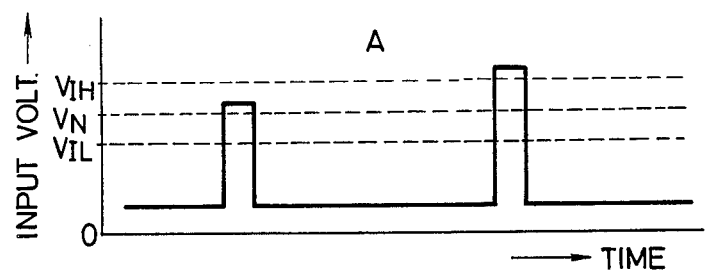
FIG. 3 is a waveform diagram showing input voltage versus output voltage on the conventional input amplifier circuit of FIG. 1.
Figure 3:
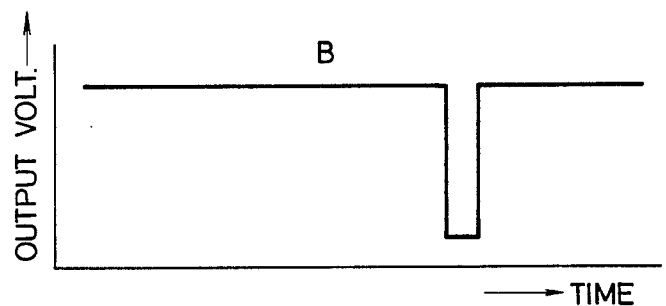
Figure 4:
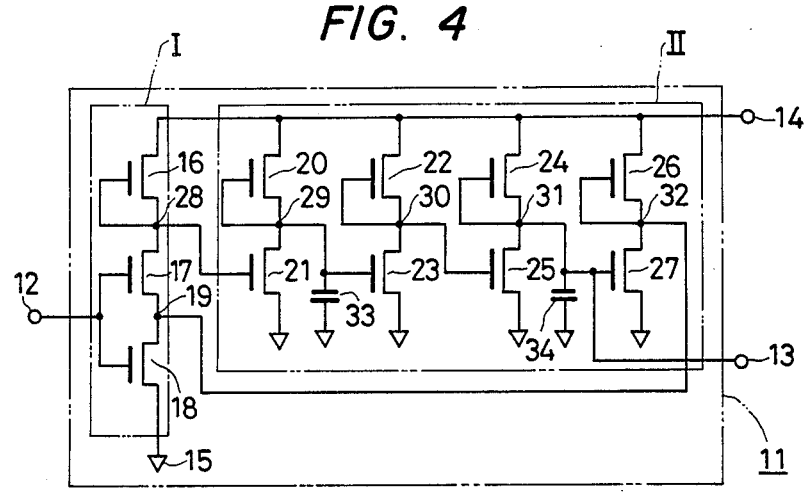
FIG. 4 is a circuit diagram showing an example of an input amplifier circuit according to the invention.

FIG. 4 is a circuit diagram of an example of an input amplifier circuit according to the present invention. In FIG. 4, reference numeral 11 designates the input amplifier circuit, 12 an input terminal, 13 an output terminal, 14 a first power source terminal for supplying a driving supply voltage $V_{DD}$, and 15 a return line serving as a second power source terminal for supplying a return line voltage such as the ground level. The input amplifier circuit is implemented with n-channel MOS-FETs, more specifically depletion type MOS FETs 16, 20, 22, 24 and 26 and enhancement MOS FETs 17, 18, 21, 23, 25 and 27. The transistors 16, 17 and 18 will hereinafter be referred to as "first, second and third transistors", respectively, for convenience in description. The first, second and third transistors 16, 17 and 18 are series-connected between the first power source terminal 14 and the return line 15, thus forming a input circuit I. The junction point 28 of the first and second transistors 16 and 17 acts as an output node of the Schmitt trigger circuit I, and the junction point 19 of the second and third transistors 17 and 18 acts as a feedback node. The gate of the first transistor 16 is connected to the output node 28, and the gates of the second and third transistors 17 and 18 are connected to the input terminal 12.

Further in FIG. 4, reference numerals 20 and 21 designate a load transistor and a driver transistor, respectively, which form a first-stage inverter circuit; 22 and 23, a load transistor and a driver transistor, respectively, which forms a second-stage inverter circuit; 24 and 25, a load transistor and a driver transistor, respectively, which form a third-stage inverter circuit; and 26 and 27, a load transistor and a driver transistor, respectively, which form a final-stage inverter circuit. In each stage, the inverter circuit is connected between the first power source terminal 14 and the return line 15, and the gate of the load transistor 20, 22, 24 or 26 is connected to the junction point of the load transistor and the driver transistor of that stage, that is, the corresponding output node. The output nodes 29, 30 and 31 of the inverter circuits of the first, second and third stages are connected to the gates of the driver transistors 23, 25 and 27 in the inverter circuits of the preceding second, third and fourth stages, respectively, to form a delay circuit II consisting of four cascade-connected inverters. The gate of the driver transistor 21 in the first-stage inverter circuit is connected to the output node 28 of the input circuit I. The output node 32 of the final-stage inverter circuit is connected to the feedback node 19 of the input circuit I. The gate of the driver transistor 27 in the final-stage inverter circuit is connected to the output terminal 13. The input circuit I and the delay circuit II constitute a Schmitt trigger amplifier as the input amplifier circuit 11.

In the above-described input amplifier circuit, the delay circuit is made up of four cascade-connected inverters; however, the invention is not limited thereto or thereby. That is, it may be made up of cascade-connected inverters in other numbers of stages, for instance, even numbers of stages, i.e., two stages or six stages.

A capacitor 33 is connected between the return line 15 and the gate of the driver transistor 23 in the second-stage inverter circuit, and similarly a capacitor 34 is connected between the return line 15 and the gate of the driver transistor 27 in the final-stage inverter circuit, to increase the delay time of the delay circuit.

The operation of the input amplifier circuit thus constructed when a signal is applied to the input terminal 12 will be described with respect to the case where the input signal is a positive logic signal.

When a voltage lower than the threshold of the third transistor 18 is applied to the input terminal 12, the input amplifier circuit 11 is maintained in a steady state. That is, the second and third transistors 17 and 18 are nonconductive, and the output node 28 of the input circuit I is raised to the high level by means of the first transistor 16. Therefore, the FET 21 is turned on, the FET 23 is turned off, the FET 25 is turned on, and the FET 27 is turned off, so that the output node 32a–d the feedback node 19 are raised to the high level. In this case, the output node 31 is at the low level, and therefore the output node 31 is also at the low level.

When the input voltage changes from the low level to the high level and exceeds the threshold voltage of the transistor 18, the third transistor 18 is placed in the low impedance state, and current flows from the first power source terminal through the FET 26, the output node 32, the feedback node 19 and the third transistor 18 to the return line 15. In this operation, the second transistor 17 is maintained in the high impedance state.

When the input voltage rises further and exceeds the sum $V_{IH}$ of the potential $V_{19H}$ of the feedback node 19 and the threshold voltage $V_{TH}$ of the second transistor 17, the second transistor 17 is placed in the low impedance state, and the potential of the output node 28 is changed to the low level by the second and third transistors 17 and 18. Therefore, the FET 21 is turned off, the FET 23 is turned on, the FET 25 is turned off, and FET 27 is turned on in succession. Thus, a predetermined delay time from the change of the input voltage from the low level to the high level, the output node 32 and the feedback node 19 are set to the low level, and the output terminal 13 is raised to the high level. This situation is maintained even when the input voltage increases further.

The case where the input voltage decreases from a value larger than the above-described value $V_{IH}$ will now be described. When the input voltage becomes lower than the sum $V_{IL}$ of the potential $V_{19L}$ of the feedback node 19 and the threshold voltage $V_{TH}$ of the second transistor 17, the second transistor 17 is placed in the high impedance state, and the output node 28 is raised to the high level from the low level. Therefore, the FET 21 is turned on, the FET 23 is turned off, the FET 25 is turned on, and the FET 27 is turned off, and the low level appears at the output terminal 13. The potential $V_{19L}$ of the feedback node 19 when the low impedance state of the second transistor 17 changes to the high impedance state as described above is lower than the voltage $V_{19L}$ at the feedback node 19 when the low impedance state of the second transistor 17 changes to the high impedance state. Accordingly, the input voltage $V_{IL}$ when the low impedance state of the second transistor 17 changes to the high impedance state is lower than the level $V_{IL}$ present when the high impedance state of the second transistor 17 changes to the low impedance state. Thus, the output voltage exhibits a hysteretic characteristic with respect to the input voltage, and changes in the output voltage are delayed by a predetermined period of time from the time of occurrence of input voltage changes.

The operation of the input amplifier circuit will now be described with respect to the case where a noise signal is applied to the input terminal 12.

First, the case will be described where, when the input voltage is at the low level, a noise signal applied to the input terminal 12 rises from the low level to the high level. When the voltage of the noise signal applied to the input terminal 12 is sufficiently lower than the threshold value of the third transistor 18, the output nodes 28 and 32 are maintained at the high level, and hence their potentials are not affected by the noise signal. When the noise signal applied to the input terminal has a level which, as indicated at a and b in FIG. 5, renders the second and third transistors 17 and 18 conductive, the output node 28 is set to the low level. Due to the fact that a signal applied to the input terminal of each inverter is delayed, before the output node of the third-stage inverter circuit (the output terminal 13) can rise to the high level, the noise signal voltage has already fallen. When the noise signal voltage becomes lower than the $V_{IH}$, the second transistor 17 is turned off. Accordingly, although the output node 28 (the input to the inverter array) is raised to the high level, the output terminal 13 is prevented from being raised to the high level. Thus, the output voltage is not affected by the noise signal.

Although the input amplifier circuit has a hysteretic characteristic as described above, as long as the feedback point 32 is at the high level, the fact that the input noise signal has fallen can be detected with the voltage level $V_{IH}$. Accordingly, the restoration operation is carried out quickly, and the noise signal is effectively eliminated. This will be described in more detail with reference to FIG. 5.

Figure 5:
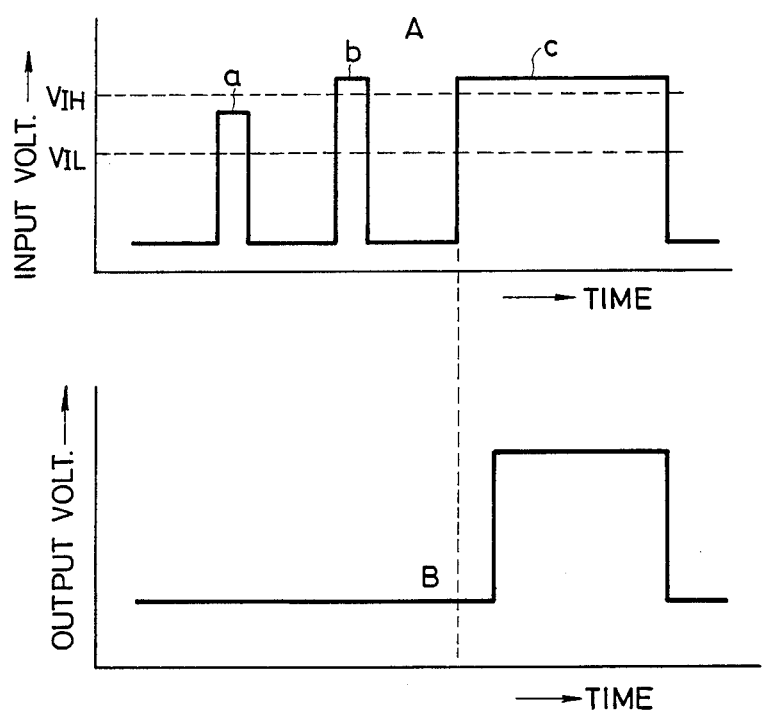
FIG. 5 is a waveform diagram showing input voltage versus output voltage in the circuit of FIG. 4.

FIG. 5 is a waveform diagram showing the response characteristic of the input amplifier circuit according to the invention. In FIG. 5, reference character A designates an input voltage waveform, and B an output voltage waveform. Further in FIG. 5, a pulse a is a noise signal which does not reach the threshold value $V_{IH}$, and a pulse b is a noise signal which does exceed the threshold value $V_{IH}$ and which has a pulse width less than the circuit delay time. Such noise signals are eliminated, thus preventing them from affecting the output voltage, as is apparent from the output voltage waveform B. A pulse c is a normal accepted input signal which does exceed the threshold value $V_{IH}$ and which has a pulse width larger than the circuit delay time. This results in the output voltage waveform B.

As described above, if an input signal applied to the input terminal 12 rises and then falls within the delay time of the inverter array (delay circuit), then such a signal will be entirely eliminated from the circuit output. If an input signal is maintained at the high level at least for the delay time, it is accepted as a normal input signal. When the input signal falls again, the Schmitt trigger characteristic becomes effective. Thus, the input amplifier circuit can eliminate noise signals effectively.

While the invention has been described with reference to the case where the input signal is raised to the high level from the low level, it should be noted that the technical concept of the invention is equally applicable to the case where the input signal is set to the low level from the high level.

In the above-described input amplifier circuit, the load transistor 26 and the driver transistor 27 forming the final-stage inverter circuit, which is a feedback drive inverter to the feedback node 19, may be replaced by a push-pull buffer circuit constructed with enhancement-type MOSFETs. The output terminal 13 may be extended from a desired one of the load FETs. Further, in the above-described input amplifier circuit, the delay circuit is made up of the inverters; however, it may be replaced by another type of delay circuit.

I claim:

1. An input amplifier circuit comprising:
   an input trigger circuit having an input terminal, an output node and a feedback node, a voltage at said output node having a hysteretic characteristic with respect to an input voltage applied to said input terminal;
   delay circuit means for supplying a potential at said output node of said trigger circuit to said feedback node of said trigger circuit with a predetermined delay time according to an input voltage applied to said input terminal, said potential at said output node providing an output signal at an output terminal;
   a first transistor connected between a first power source terminal and said output node;
   a second transistor having its main current electrodes connected between said output node and said feedback node and having a control electrode connected to said input terminal; and
   a third transistor having its main current electrodes connected between said feedback nodes and a second power source terminal and having a control electrode connected to said input terminal.

2. The input amplifier circuit as claimed in claim 1, wherein said first transistor is a depletion-type MOS transistor, and said second and third transistors are enhancement-type MOS transistors.

3. An input amplifier circuit comprising:
   a input circuit comprising a series circuit of first, second and third transistors connected between first and second power source terminals, control electrodes of said second and third transistors being connected to an input terminal; and
   a delay circuit comprising a plurality of inverter circuits, each comprising a series circuit of a load transistor and a driver transistor having their main current inputs connected between said first and second power source terminals, said inverter circuits being arranged in plural cascade-connected stages with a control electrode of said driver transistor in a first stage inverter circuit being connected to a junction point of said first and second transistors in said input circuit, a junction point of said driver transistor and load transistor in a last stage inverter circuit being connected to a junction point of said second and third transistors in said input circuit, and a control electrode of said driver transistor in the last stage inverter circuit being connected to an output terminal.

4. The input amplifier circuit as claimed in claim 3, wherein said first, second and third transistors in said input circuit and said load transistors and driver transistors forming said inverter circuits in said delay circuits are MOS transistors, a control input point of said driver transistor in each stage being connected to a junction point of said load transistor and said driver transistor of another stage inverter circuit or to said junction point of said first and second transistor.

5. The input amplifier circuit as claimed in claim 3, wherein said first transistor in said input circuit and said load transistors in said inverter circuits forming said delay circuit are depletion-type MOS transistors, and said second and third transistors in said input circuit and said driver transistors in said inverter circuits forming said delay circuit are enhancement-type MOS transistors.

6. The input amplifier circuit as claimed in claim 4, further comprising a capacitor connected between said gate of said driver transistor in said last stage inverter circuit and said second power source terminal.

7. The input amplifier circuit as claimed in claim 4, wherein said delay circuit comprises an even number of inverter circuits arranged in cascade-connected stages, each said inverter circuit comprising a capacitor connected between a gate input of a respective driver transistor and said second power source terminal.

8. The input amplifier circuit as claimed in claim 3, wherein said last stage inverter circuit comprises a push-pull buffer circuit comprising a pair of enhancement-type MOS transistors, a control input of said drive transistor in said last stage inverter circuit being connected to a junction point of said driver transistor and load transistor of another stage of said delay circuit.

9. An input amplifier circuit comprising:
an input trigger circuit having an input terminal, an output node and a feedback node, a voltage at said output node having a hysteretic characteristic with respect to an input voltage applied to said input terminal; and
an even plurality of inverter circuits coupled in plural, cascade-connected stages for supplying a potential at said output node of said trigger circuit to said feedback node of said trigger circuit with a predetermined delay time according to an input voltage applied to said input terminal, said potential at said output node providing an output signal at an output terminal, an input of a first stage inverter circuit being connected to said output node of said input circuit and an output node of a last stage inverter circuit being connected to said feedback node of said input circuit.

10. The input amplifier circuit as claimed in claim 9, wherein each said inverter circuit comprises a series circuit of a depletion-type MOS transistor and an enhancement-type MOS transistor having their main current inputs connected between first and second power source terminals, a gate input of one of said MOS transistors being connected to the connection between said MOS transistors of another stage or to said output node.

11. The input amplifier circuit as claimed in claim 10, further comprising a capacitor connected between said gate of said enhancement-type MOS transistor in said last stage inverter circuit and said second power source terminal.

* * * * *